United States Patent

Fazan et al.

[11] Patent Number: 5,985,732
[45] Date of Patent: *Nov. 16, 1999

[54] METHOD OF FORMING INTEGRATED STACKED CAPACITORS WITH ROUNDED CORNERS

[75] Inventors: Pierre C. Fazan; Thomas A. Figura; Klaus F. Schuegraf, all of Boise, Id.

[73] Assignee: Micron Technology, Inc., Boise, Id.

[*] Notice: This patent is subject to a terminal disclaimer.

[21] Appl. No.: 08/974,204

[22] Filed: Nov. 19, 1997

Related U.S. Application Data

[63] Continuation of application No. 08/688,542, Jul. 30, 1996, Pat. No. 5,849,624.

[51] Int. Cl.⁶ .................................................. H01L 21/70
[52] U.S. Cl. .......................................... 438/398; 438/397
[58] Field of Search ................................. 438/397, 398, 438/396

[56] References Cited

U.S. PATENT DOCUMENTS

| | | |
|---|---|---|
| 5,102,832 | 4/1992 | Tuttle . |
| 5,112,773 | 5/1992 | Tuttle . |
| 5,182,232 | 1/1993 | Chhabra et al. . |
| 5,185,282 | 2/1993 | Lee et al. . |
| 5,191,509 | 3/1993 | Wen . |
| 5,202,278 | 4/1993 | Mathews et al. . |
| 5,223,729 | 6/1993 | Kudoh et al. ........................ 257/296 |
| 5,266,514 | 11/1993 | Tuan et al. . |
| 5,302,233 | 4/1994 | Kim et al. . |
| 5,318,920 | 6/1994 | Hayashide . |
| 5,320,880 | 6/1994 | Sandhu et al. . |
| 5,340,763 | 8/1994 | Dennison . |
| 5,340,765 | 8/1994 | Dennison et al. ...................... 437/52 |
| 5,342,800 | 8/1994 | Jun . |
| 5,350,707 | 9/1994 | Ko et al. . |
| 5,354,705 | 10/1994 | Mathews et al. ...................... 437/52 |
| 5,366,917 | 11/1994 | Watanabe et al. . |
| 5,372,962 | 12/1994 | Hirota et al. . |
| 5,387,531 | 2/1995 | Rha et al. . |
| 5,405,801 | 4/1995 | Han et al. . |
| 5,407,534 | 4/1995 | Thakur . |
| 5,481,127 | 1/1996 | Ogawa ................................ 257/308 |
| 5,488,011 | 1/1996 | Figura et al. . |
| 5,489,548 | 2/1996 | Nishioka et al. . |
| 5,492,854 | 2/1996 | Ando ................................ 437/60 |
| 5,494,841 | 2/1996 | Dennison et al. . |
| 5,597,756 | 1/1997 | Fazan et al. ........................ 437/52 |
| 5,639,689 | 6/1997 | Woo . |
| 5,696,014 | 12/1997 | Figura . |
| 5,753,558 | 5/1998 | Akram et al. . |
| 5,760,434 | 6/1998 | Zahwak et al. . |
| 5,786,250 | 7/1998 | Wu et al. . |

OTHER PUBLICATIONS

Watanabe, et al., "Advanced Technique for Fabricating Hemispherical Grained (HSG) Silicon Storage Electrodes," p. 295, IEEE Transactions on Electron Devices, vol. 42, No. 2, Feb. 1995.

Watanabe, et al., "Hemispherical Grained Si Formation Si Formation on in situ Phosphorus Doped Amorphous–Si Electrode for 256Mb DRAM's Capacitor," p. 1247, IEEE Transactions on Electron Devices, vol. 42, No. 7, Jul. 1995.

*Primary Examiner*—Charles Bowers
*Assistant Examiner*—Martin Sulsky
*Attorney, Agent, or Firm*—Knobbe, Martens, Olson & Bear LLP

[57] ABSTRACT

Disclosed is an improved stacked capacitor with rounded corners for increasing capacitor breakdown voltage, and a method of constructing the same. The preferred method comprises rounding corners of a container-shaped bottom electrode. In particular, sharp corners of a pre-fabricated conductive silicon container are exposed to an ammonium hydroxide/peroxide mixture. The slow etching effect of the clean rounds angled surfaces thereby minimizing the high field effects usually associated with corners and other angled surfaces. Reducing such field effects by reducing or eliminating sharp corners helps prevent breakdown of the capacitor structure dielectric. When the conductive container includes a rough layer, such as hemispherical grained silicon, the invention provides the additional advantage of separating individual hemispherical grains, thus allowing later deposition of a uniformly thick dielectric layer.

11 Claims, 5 Drawing Sheets

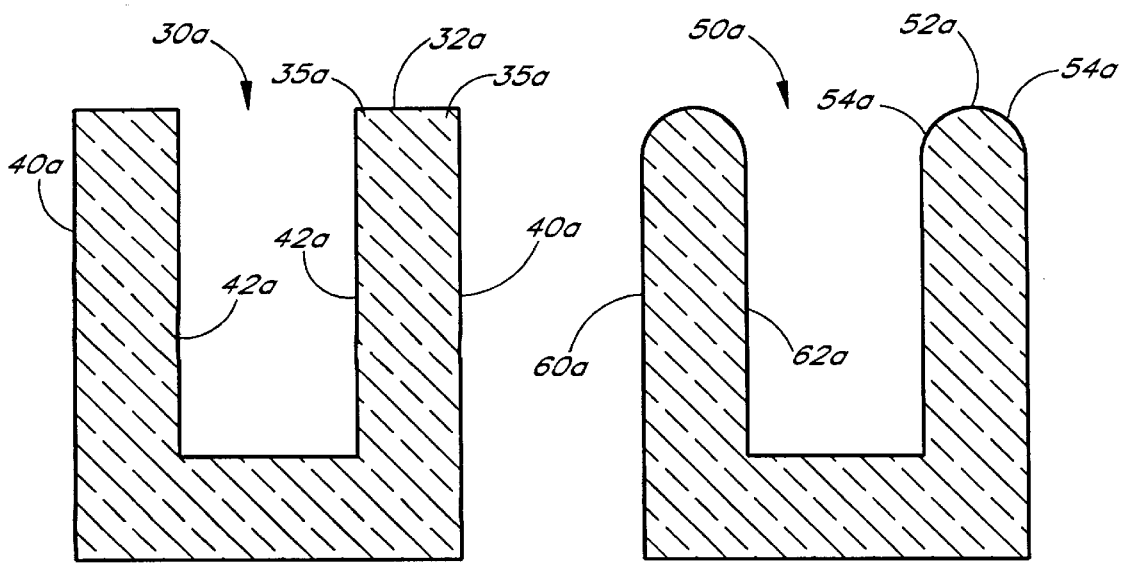
FIG. 4A
FIG. 5A
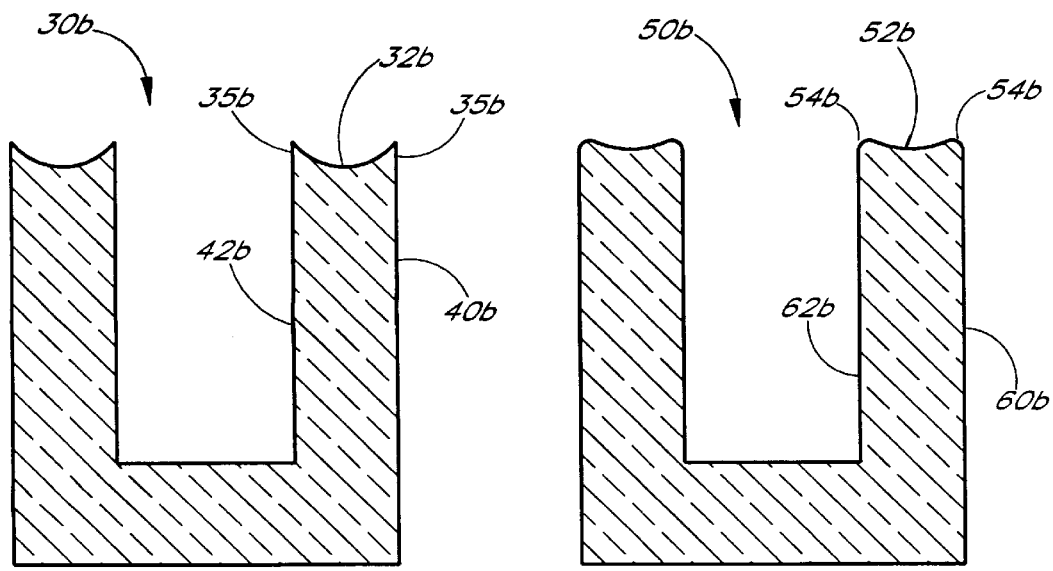
FIG. 4B
FIG. 5B

METHOD OF FORMING INTEGRATED STACKED CAPACITORS WITH ROUNDED CORNERS

RELATED APPLICATION

This application is a continuation of U.S. patent application Ser. No. 08/688,542, filed Jul. 30, 1996 now U.S. Pat. No. 5,849,624.

FIELD OF THE INVENTION

The present invention relates to integrated stacked capacitors and more particularly to container capacitor bottom electrodes for use in dynamic random access memories (DRAMs).

BACKGROUND OF THE INVENTION

Recent advances in the miniaturization of integrated circuits have led to smaller chip areas available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell.

Operational problems arise when the DRAM capacitor capacitances fall below certain minimum thresholds. Firstly, the alpha-particle component of normal background radiation will generate hole-electron pairs in the silicon substrate plate of a cell capacitor. This phenomena will cause the charge within the affected cell capacitor to rapidly dissipate, resulting in a "soft" error. Secondly, as cell capacitance is decreased, the cell refresh time must generally be shortened, thus requiring more frequent interruptions for refresh overhead. Thus it is important for a DRAM designer to increase, or at least maintain, cell capacitance as cell size shrinks, without resorting to processes that reduce product yield or that markedly increase the number of masking and deposition steps in the production process.

Traditionally, capacitors integrated into memory cells have been patterned after the parallel plate capacitor. A dielectric material is deposited between the deposition of two conductive layers, which form the capacitor plates or electrodes. Several techniques have recently been developed to increase the total charge capacity of the cell capacitor without significantly affecting the chip area occupied by the cell. These include the use of new materials characterized by high dielectric constants, which permits much smaller interelectrode spacing.

Other techniques concentrate on increasing the effective surface area of the electrodes by creating folding structures such as trench or stacked capacitors. Such structures better utilize the available chip area by creating three dimensional shapes to which the conductive plates and interlayer dielectric conform. For example, U.S. Pat. No. 5,162,248 and U.S. Pat. No. 5,340,765, issued Aug. 23, 1994 to Dennison et al., both assigned to the assignee present invention, disclose related processes for forming capacitor structures resembling a cylindrical container. A polycrystalline silicon (polysilicon) container is first formed, both the inside and outside surfaces of which are available for use as the bottom electrode. More complex structures, such as the container-within-container structure disclosed in U.S. Pat. No. 5,340,763, issued Aug. 23, 1994 to Dennison, may further increase electrode surface area and allow the extension of conventional fabrication materials to future generation memory devices. The capacitor dielectric and top electrode may then be successively deposited.

The effective surface area of the plates may be even further increased by roughening the surface of the polysilicon layer. For example, rough layers may be formed by preferentially etching at grain boundaries of deposited polysilicon. Alternatively, hemispherical grained (HSG) silicon may be formed by gas phase nucleation or surface seeding. Among other processes, surface seeding may be accomplished by annealing a layer of amorphous silicon at a critical temperature and pressure, inducing surface migration of silicon atoms. Relatively large, hemispherical grains form by this redistribution, and the resultant HSG silicon layer provides a much larger electrode surface area than planar polysilicon.

Despite the greater electrode surface area provided by folding structures and roughened electrode surfaces, and partially because of these techniques, there remain limitations on capacitance of memory cells. The limited space over the access devices of dense circuits confines three dimensional folding stacked capacitors to a small volume. The capacitor dielectric must therefore be extremely thin to leave room for the top electrode. Furthermore, HSG silicon may grow upwards of 600 Å, occupying a great deal of the cell volume and further limiting the thickness of the capacitor dielectric. While dielectric thickness should be minimized in order to maximize capacitance, too thin a capacitor dielectric risks leakage current across the capacitor electrodes. Leakage current may result from pinholes in the dielectric and quantum tunneling effects, both of which phenomena are more likely to occur with thinner dielectrics. Thin capacitor dielectric layers are thus characterized by a low breakdown voltage, limiting the charge which may be stored on the bottom electrode before breakdown leakage occurs.

In addition, grains of HSG silicon may be so close together that dielectric bridging occurs between grains, creating thicker dielectric between grains than over grain surfaces. If the dielectric is deposited to the minimal thickness between HSG silicon grains, the dielectric over the grains will be too thin and lead to breakdown. Alternatively, when the dielectric is deposited to the minimal thickness over HSG silicon grains, the dielectric between the grains is too thick, leading to reduced capacitance.

The problems with thin dielectrics are exacerbated at corners of the cell electrodes. Standard manufacturing techniques, including planarization steps in the creation of stacked capacitors, result in a stacked capacitor structure with sharply angled edges. Higher charge densities naturally accumulate around angled corners, creating high electric field, or "edge effects." These high field effects further lower the breakdown voltage of the relatively thin dielectric layer, consequently reducing capacitance of the memory cell.

A need therefore exists for increasing the capacitance and reliability of an integrated memory cell capacitor. Preferably, such a capacitor and the process for its fabrication should be compatible with current integrated circuit fabrication techniques and structures in order to minimize the costs of implementation.

SUMMARY OF THE INVENTION

The invention is directed to minimizing angled surfaces in stacked capacitors and related structures, thereby increasing the breakdown voltage of the capacitor. Accordingly, a method is disclosed for fabricating a bottom electrode with rounded corners for an integrated memory cell capacitor.

The method comprises formation of a bottom electrode structure for an integrated circuit, such that sharp bottom electrode corners result. A rounding step thereafter accomplishes the objectives of the present invention.

In accordance with a preferred embodiment, the bottom electrode comprises a conductive container having sharp corners. For example, the sharp corners may result from a planarization step, comprising either chemical mechanical planarization (CMP) or dry etch. The disclosed container comprises silicon so that the rounding step of the preferred embodiments comprises exposing the sharp corners to an isotropic silicon etch. Specifically, an Ammonium hydroxide ($NH_4OH$) and Peroxide ($H_2O_2$) Mixture (APM) is used to round the corners of the preferred silicon container. Although the entire container may be exposed to the APM, corners (such as those at the lip of a container bottom electrode) have more surface area per unit volume exposed to APM then planar areas. Thus, the APM exposure results in a rounding of those corners.

Additionally, the disclosed process may be implemented in conjunction with a hemispherical grained (HSG) silicon layer which forms part of the bottom electrode. If formed over or within the bottom electrode prior to the rounding step, individual grains of the HSG silicon will be slightly separated, allowing later deposition of a uniformly thick capacitor dielectric. Capacitance of the memory cell is thereby increased relative to unetched HSG silicon on a bottom electrode.

BRIEF DESCRIPTION OF THE DRAWINGS

FIGS. 4A and 5A are schematic representations of the capacitor container before and after a rounding step, in accordance with a first preferred embodiment of the present invention, wherein the container has been previously planarized by chemical mechanical planarization.

FIGS. 4B and 5B are schematic representations of the capacitor container before and after a rounding step, in accordance with a second preferred embodiment of the present invention, wherein the container has been previously planarized by a dry etch process.

DETAILED DESCRIPTION OF THE PREFERRED EMBODIMENT

The present invention is directed to increasing capacitance and improving memory cell reliability by rounding the sharp edges at the corners of an integrated capacitor electrode. The process steps described below serve as an example as well as a preferred method of implementing the present invention. Although described in the context of a polysilicon bottom electrode for a container capacitor, the skilled artisan may find application for the present invention for other capacitor configurations and materials. The invention has particular utility for fabrication processes in which capacitor electrodes are formed with sharp corners, such as by planarization steps.

Figure 1:
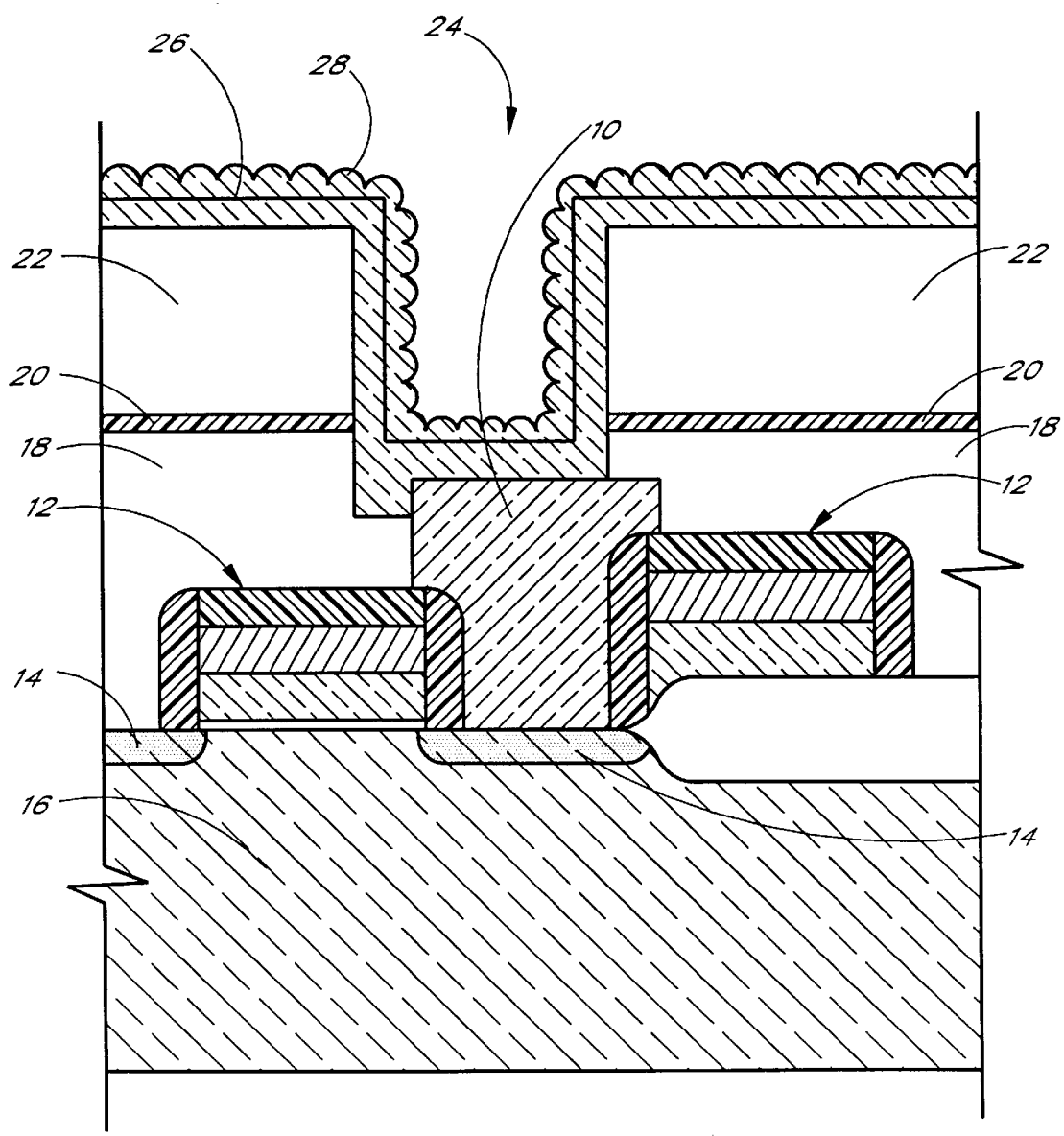
FIG. 1 is a cross-sectional view of a partially fabricated integrated circuit memory cell. The cell is shown after formation of a conductive layer over a structural layer and into a via within the structural layer, in accordance with preferred embodiments of the present invention.

FIG. 1 illustrates a partially fabricated memory cell within an integrated circuit, representing a starting point for the preferred embodiments of the present invention. A conductive plug 10 between neighboring word lines 12, forms electrical contact with an active area 14 of a semiconductor substrate 16, such as a silicon wafer. A planarized insulating layer 18, preferably oxide, overlies the word lines 12 and plug 10. A thin etch stop film 20, preferably silicon nitride, is formed superjacent the insulating layer 18, and a structural layer 22 overlies the etch stop 20 in turn.

A contact via 24 is then formed within the structural layer 22, thereby exposing the conductive plug 10. Preferably, the via 24 is etched anisotropically through a mask, resulting in a cylindrical via 24 with vertical sidewalls, in accordance with conventional integrated circuit via formation. (FIG. 1 is a schematic cross-section which does not show the back wall of the via 24. In reality, the container resembles a three-dimensional cylinder.) Preferably, the via 24 has a diameter between about 0.2 micron and 1 micron, more preferably between about 0.3 micron and 0.5 micron, and most preferably about 0.45 micron.

An electrode material 26 is thereafter deposited into the via 24 and over the structural layer 22, forming the structural basis for the capacitor bottom electrode to be further defined in process steps discussed below. The electrode material 26 may comprise any of a number of conductive materials, including but not limited to silicon, refractory metal suicides and metals. The preferred embodiments, however, incorporate conductively doped polycrystalline silicon (polysilicon, or simply poly) for the electrode material 26, having an overall thickness between about 100 Å and 1,000 Å, more preferably between about 200 Å and 800 Å, and most preferably about 600 Å. Fabrication to this point is conventional and may be replaced by other methods of forming container capacitors. Similar methods, for example, have been described in U.S. Pat. No. 5,340,765, issued to Dennison et al. and assigned to the assignee of the present invention, the disclosure of which is hereby incorporated by reference.

The electrode material 26 of the preferred embodiments also includes a rough conductive layer 28, in the form of hemispherical grained (HSG) silicon. As discussed in the "Background" section above, the HSG silicon 28 serves to increase the surface area of the bottom electrode to which the capacitor dielectric and top electrode conform. However, it should be understood that many advantages of the present invention do not depend upon the presence of the HSG silicon 28, and alternative embodiments of the present invention may include bottom electrodes having planar surfaces. On the other hand, the invention has particular utility in the context of HSG silicon-lined capacitor containers, and other embodiments may be conceived of wherein a rough conductive layer is formed over both the inside and outside surfaces of the bottom electrode.

For the preferred embodiment, the HSG silicon 28 is formed following deposition of the polysilicon layer. Many different processes of roughening or texturizing conductive layers are known in the art. For example, U.S. Pat. No. 5,102,832, issued to Tuttle, U.S. Pat. No. 5,112,773, issued to Tuttle, U.S. Pat. No. 5,320,880, issued to Sandhu et al., U.S. Pat. No. 5,202,278, issued to Mathews et al., all disclose various techniques for forming rough silicon. U.S. Pat. No. 5,182,232, issued to Chhabra et al. discloses a method of texturizing metal silicide. Any of the processes disclosed in the above references may be incorporated into the present invention. Most preferably, however, a layer of amorphous silicon is subjected to a vacuum anneal, causing a redistribution of silicon atoms. U.S. Pat. No. 5,407,534, issued to Thakur and assigned to the assignee of the present invention, discloses such a texturizing vacuum anneal. The disclosure of this patent is hereby incorporated by reference.

A layer of amorphous silicon is deposited over the polysilicon to a preferred thickness between about 100 Å and 500 Å, most preferably about 300 Å. The structure is preferably conductively doped and then heated to a temperature in the range of between 450° C. and 650° C., more preferably between about 560° C. and 620° C., most preferably around 600° C., while the chamber pressure is maintained between about $1\times10^{-10}$ Torr and $1\times10^{-3}$ Torr. An inert gas (e.g., argon), is bled into the anneal chamber. The surface migration of the silicon atoms to the nucleation sites results in the formation of a rough or texturized, granular surface having a much greater surface area for charge storage. The resulting electrode material 26, including HSG silicon 28, forms the bottom or storage electrode of a memory cell capacitor.

Figure 2:
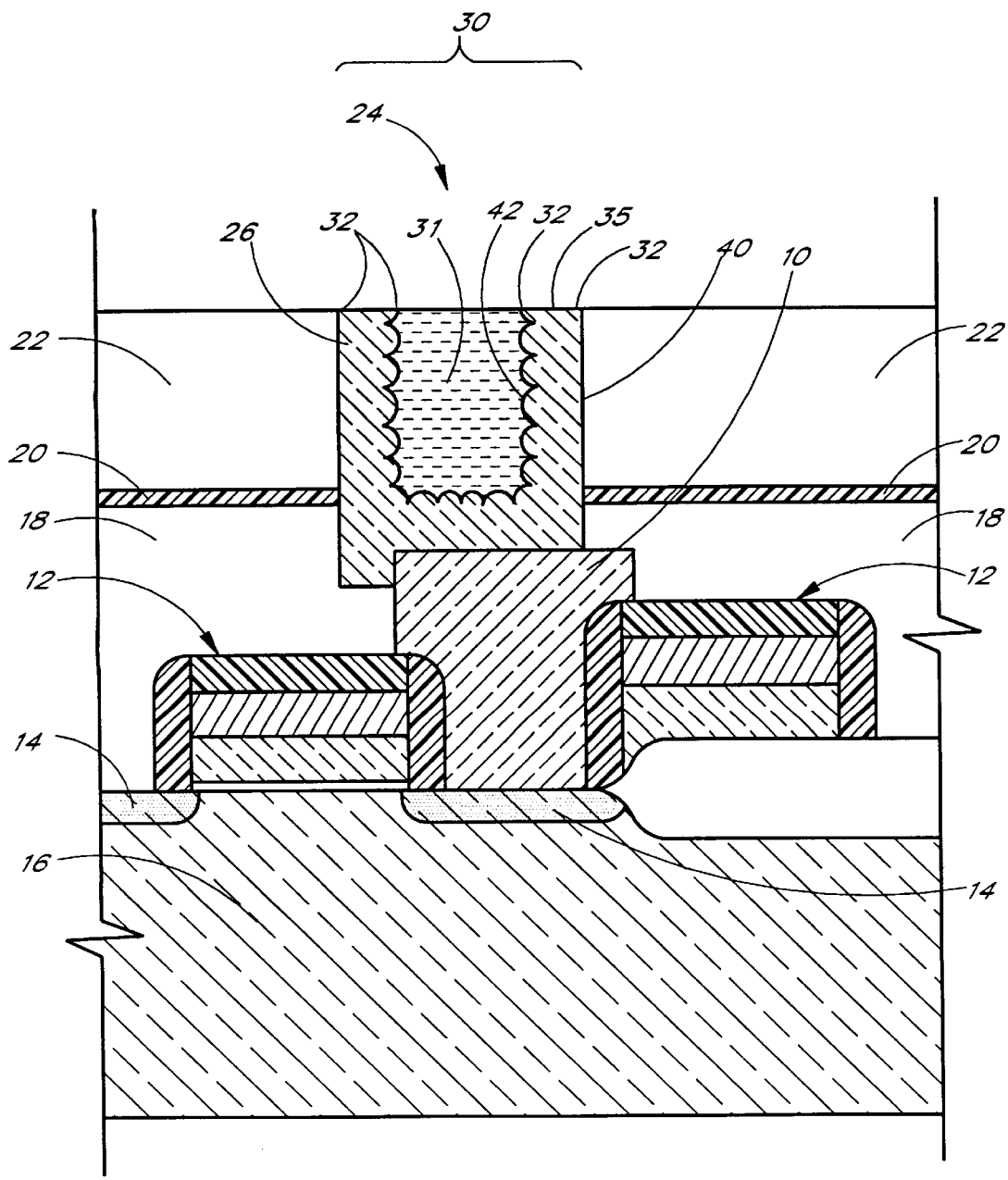
FIG. 2 illustrates the memory cell of FIG. 1, following a planarization step which defines a capacitor container.

FIG. 2 illustrates the structure of FIG. 1 after a planarizing step defines a conductive container 30 formed of the conductive electrode material 26 (including the HSG silicon 28). The container will serve as the capacitor bottom electrode for the memory cell. Preferably, a photoresist filler 31 first fills the via 24, protecting the container 30 from harmful etchants. A planarizing step then removes at least horizontal portions of the electrode material 26 which overlie the structural layer 22 (see FIG. 1). Upper portions of the structural layer 22 may also be removed, depending upon the planarization process chosen. As a result of the planarization, a container upper surface or rim 32 is exposed, extending around the circumference of the three-dimensional container 30. At relatively sharp edges or corners 35, the rim 32 meets with an outside container surface 40 and an inside container surface 42 (comprising HSG silicon for the preferred embodiment). As shall be described below in connection with FIGS. 4A to 5B, different planarization processes may result in different corner configurations.

In accordance with the first preferred embodiment of the present invention, the planarization comprises a chemical mechanical planarization (CMP) or polishing step. Prior to the CMP step, the conductively lined via 24 (FIG. 1) should be filled to overflowing with a photoresist filler 31. The resist 31 protects the container inner surface 42, while the structural layer 22 protects the outside surface 40. The preferred CMP step comprises a polishing step in the presence of a silica-rich slurry. A schematic representation of the rim 32a produced by CMP is illustrated in FIG. 4A.

In accordance with a second preferred embodiment of the present invention, the planarization comprises a dry etch process. The resist filler 31 first fills the conductively lined via 24 (FIG. 1). The resist is then partially recessed within the via 24, preferably below the horizontal portions of the conductive electrode material 26 (FIG. 1). This step preferably comprises a timed selective resist strip, such as a pirhana bath. Thereafter, exposed horizontal portions of the electrode material 26 are anisotropically etched in a reactive ion etch (RIE) chamber. Most preferably, where the electrode material 26 comprises polysilicon, the dry etch planarization comprises $SF_6$ or $NF_3$ or HBr. This dry etch should be performed until the structural layer 22 is exposed and cleaned of the overlying polysilicon. A schematic representation of the rim 32b produced by dry etch planarization is illustrated in FIG. 4B.

Figure 3:
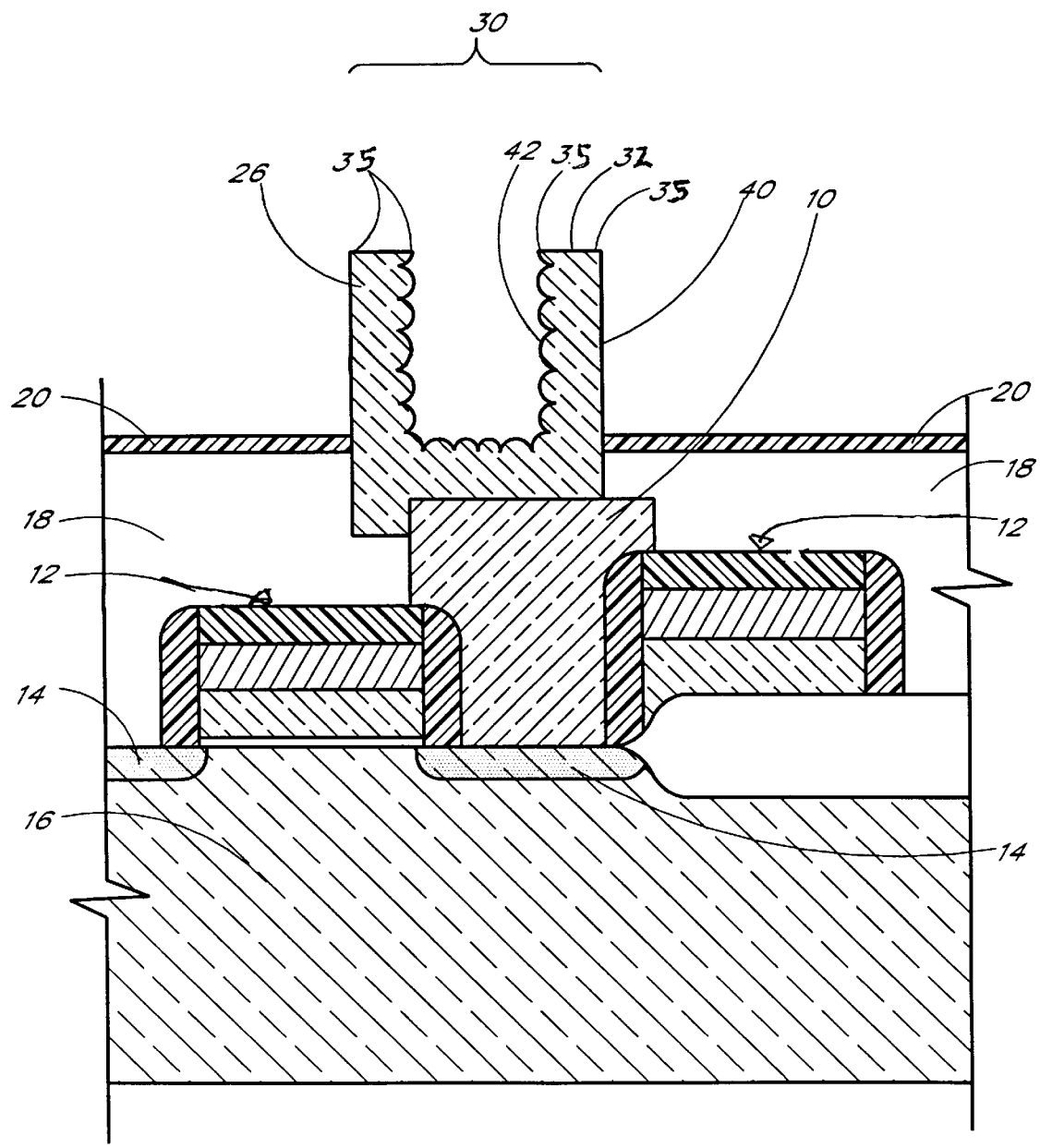
FIG. 3 is a cross-sectional view of the memory cell of FIG. 2, after removal of the structural layer.

FIG. 3 illustrates the memory cell of FIG. 2 after the structural layer 22 and resist filler 31 have been removed. The filler 31 may be removed by a standard resist strip and the exposed structural layer 22 is preferably selectively etched, following the planarization. For example, where the structural layer 22 comprises oxide, it may be removed by a selective wet oxide etch. The etch stop film 20 provides a definite stopping target for the etch. It will be understood, though, that etch stop film 20 is not essential, as time-controlled etch techniques may sufficiently remove the structural layer 22 while maintaining the electrical isolation of the underlying insulating layer 18. For example, a diluted HF solution (between 10:1 and 100:1 $H_2O$:HF) may etch the BPSG at a controllable rate to the appropriate level, and buffering agents such as $NH_4F$ may stabilize the reactions to maintain a constant etch rate.

The preferred container structure 30 is cylindrical in shape, with a preferred diameter of about 0.5 micron (5,000 Å). The container walls, comprised of the electrode material 26 (which includes the HSG silicon 28), are approximately 600 Å in thickness. The small dimensions of the container 30, especially of the interior volume, limit the thickness of the capacitor dielectric and top electrode layers which are to be deposited within the container 30. As discussed in the "Background" section above, the limited thickness of the dielectric, combined with electric field edge effects at the container corners 35, ordinarily lead to low breakdown threshold and risk of leakage current at the corners 35. The rounding step of the present invention alleviates this problem by smoothing the sharp corners 35.

FIGS. 4A and 4B are enlarged, schematic representations of the container 30 of the first and second embodiments, respectively, shown in isolation. For an understanding of the general applicability of the present invention, the HSG silicon 28 of the preferred embodiments is left out of these schematic representations. It will be understood, however, that the HSG silicon 28 represents only a microstructure over the container surfaces. The rounding step of the present invention operates on the macrostructure of the container 30, namely the sharp corners 35 at the joint of rim 32 and container surfaces 40 and 42, regardless of the presence or absence of any microstructure. For convenience in discussion of the rounding step in FIGS. 4A–5B, corresponding portions of the structure will be referred to by a common reference numeral, followed by an "a" or a "b" for the first and second embodiments, respectively.

FIG. 4A illustrates the container 30a of the first preferred embodiment, wherein the planarization step comprises a CMP process. As illustrated, the rim 32a is relatively planar, resulting in corners 35a of approximately 90° (that is, the rim 32a is oriented at approximately 90° to container sidewalls 40a and 42a). Although the stored charge may be evenly distributed over surface areas of the container sidewalls 40a and 42a and rim 32a during circuit operation when the DRAM memory cell is in an "on" state, the spatial charge concentration (charge per unit volume) is greater at the corners 35a. This increased charge density leads to the field edge effects and lower breakdown voltage mentioned above.

Referring now to FIG. 5A, a modified container 50a is shown following a rounding step, in accordance with the present invention. The resultant container lip 52a takes on a rounded appearance, characterized by a center peak and bevelled edges 54a. Charge stored at the surfaces of the container 50a, which acts as the capacitor bottom electrode during operation, results in much lower spatial charge densities around the bevelled corners 54a than at unrounded corners 35a (FIG. 4A). While the sidewall surfaces 40a and 42a (FIG. 4A) are also slightly etched, the relative positions of the modified exterior surface 60a and interior surface 62a are not significantly different, such that thickness of the container sidewalls remains relatively constant (e.g., only 10–20 Å of 600 Å removed). On the other hand, where one or both of the surfaces have been previously roughened (such as the HSG silicon 28 of the preferred embodiment, depicted in FIG. 1) the roughened surfaces will be modified as described more fully below.

Similarly, FIG. 4B illustrates the container 30b of the second preferred embodiment, wherein the planarization step comprises a dry etch, as described above. As illustrated, the rim 32b has the shape of a concave trough around the top of the container, resulting in extremely sharp corners 35b of less than 90°0 (that is, the rim surface 32b is less than 90° to container sidewalls 40b and 42b). During circuit operation, spatial charge densities at these acute corners 35b would be even higher than at the 90° corners 33a produced by CMP (see FIG. 4A). For the preferred dimensions and processes, each prong or corner 35b extends approximately 100 Å to 200 Å above the trough of the rim 32b and a base width (measured arbitrarily close to the trough) of about 20 Å to 50 Å.

Referring now to FIG. 5B, a modified container 50b is shown following the rounding step, in accordance with the present invention. The resultant container lip 52b has dulled corners 54b, and at least a shallower center trough. Thus, as with the first embodiment, the rounding step of the present invention reduces the concentration of electrode surface area per unit volume in the vicinity of bottom electrode corners, thus reducing edge effects in operation. It will be understood that an extended rounding step may further round the corners 54b until the structure resembles FIG. 5A. Such continued etching, however, may be achieved at the risk of damaging the container's structural integrity.

Although FIGS. 4A–5B show the use of an APM etch to round the corners 35 of a container 30 planarized by either a dry etch or by chemical mechanical planarization, it will be understood that the present invention may be implemented to round corners of bottom electrode configurations other than the container 30 of the present invention. Rounding the corners of a semiconductor structure helps to avoid the charge build-up and high field effects associated with angled edges.

The rounding step of the present invention is now described in detail. Henceforth, portions of the container 30 will be referred to by a common reference numeral, since the rounding step has similar effects on corresponding portions of both preferred embodiments described above. Preferably, the rounding step comprises an isotropic etch of the bottom electrode after problematic corners 35 have been exposed. For the preferred embodiments, this occurs after the structural layer 22 has been removed. Thus, the lip 32, inner sidewalls 42 and outer sidewalls 40, are all exposed to the isotropic etch. Exposure to the etchant results in a rounding of the corners 35. As can be seen in FIGS. 4A or 4B, each corner 35 of the container 30 has significantly more area per unit volume exposed to the etch than the flat surfaces 40 and 42 of the container 30. Thus the increased exposure to etchant at the corners results in slightly more electrode material being etched at the corners 35, thereby rounding the edges 35 created by planarization.

The container 30 of the preferred embodiments comprises doped polysilicon. Accordingly, the preferred rounding step comprises exposing the container 30 to an etchant which controllably erodes silicon. The particular etchant used comprises an Ammonium hydroxide ($NH_4OH$) and Peroxide ($H_2O_2$) Mixture (hereinafter referred to as an "APM"), diluted in water. The ratio of $NH_4OH$ to $H_2O_2$ to $H_2O$ is preferably within the range of 10:1:1 to 0.5:1:1, more preferably 7:1:1 to 1:1:1, and most preferably about 5:1:1. Assuming that the most preferred concentration of APM is used, the silicon should be exposed to the APM etchant for a predetermined time period ranging from a few minutes to around an hour. Preferably, exposure to the APM is between about 5 minutes and 30 minutes, more preferably between about 10 minutes and 20 minutes, and most preferably about 15 minutes. Exposing the silicon for the preferred time duration using the preferred APM ratio will result in the etching away of approximately 10 to 20 Å of silicon.

The invention has been reduced to practice using the preferred parameters set forth above. It has been found that utilizing the APM clean to round container edges results in an increased breakdown voltage for the completed capacitor. In particular, capacitor breakdown voltage was increased by at least 0.2 volts when the bottom electrode was fabricated as described above, as compared to bottom electrode fabrication without the rounding step.

For the preferred embodiments, wherein the capacitor bottom electrode includes HSG silicon, the rounding step of the present invention may also increase overall capacitance. The preferred APM etch, used to round the container corners 35, also etches the silicon of the container exterior surface 40 and interior surface 42 (see FIG. 3). The interior surface 42 is defined by the HSG silicon layer 28 (see FIG. 1). The APM etch will evenly etch all exposed surfaces, reducing the size of each hemispherical grain slightly, and thus increasing the separation between grains of the modified interior surface 62. It will be understood that, for embodiments where the exterior surface 40 is also roughened, a similar effect would be produced in the modified exterior surface 60.

As disclosed in the co-pending U.S. Patent Application of Figura, entitled "A Method for Increasing Capacitance of an HSG Rugged Capacitor Using A Post Deposition Wet Etch," Ser. No. 08/209,661, filed Mar. 11, 1994, and in the related co-pending U.S. Patent Application of Figura, entitled "A Method For Increasing Capacitance of an HSG Rugged Capacitor Using A Phosphine Rich Oxidation and Subsequent Wet Etch", Ser. No. 08/209,659, filed Mar. 11, 1994, increasing separation of HSG silicon grains reduces dielectric bridging between grains. Both of these pending applications are assigned to the assignee of the present invention, and are hereby incorporated by reference. A more uniformly thick dielectric layer may thus be deposited over the bottom electrode. This, in turn, results in an increased overall capacitance by allowing deposition of the minimal dielectric thickness adequate to avoid most pinhole and tunneling leakage problems.

The present invention increases capacitor breakdown voltage regardless of whether the container 30 which is exposed to the etchant includes a roughened conductive layer. However, the preferred APM etch entails additional benefits where the bottom electrode includes roughened surfaces, such as the HSG layer 28 on the interior of preferred container 30.

Figure 6:
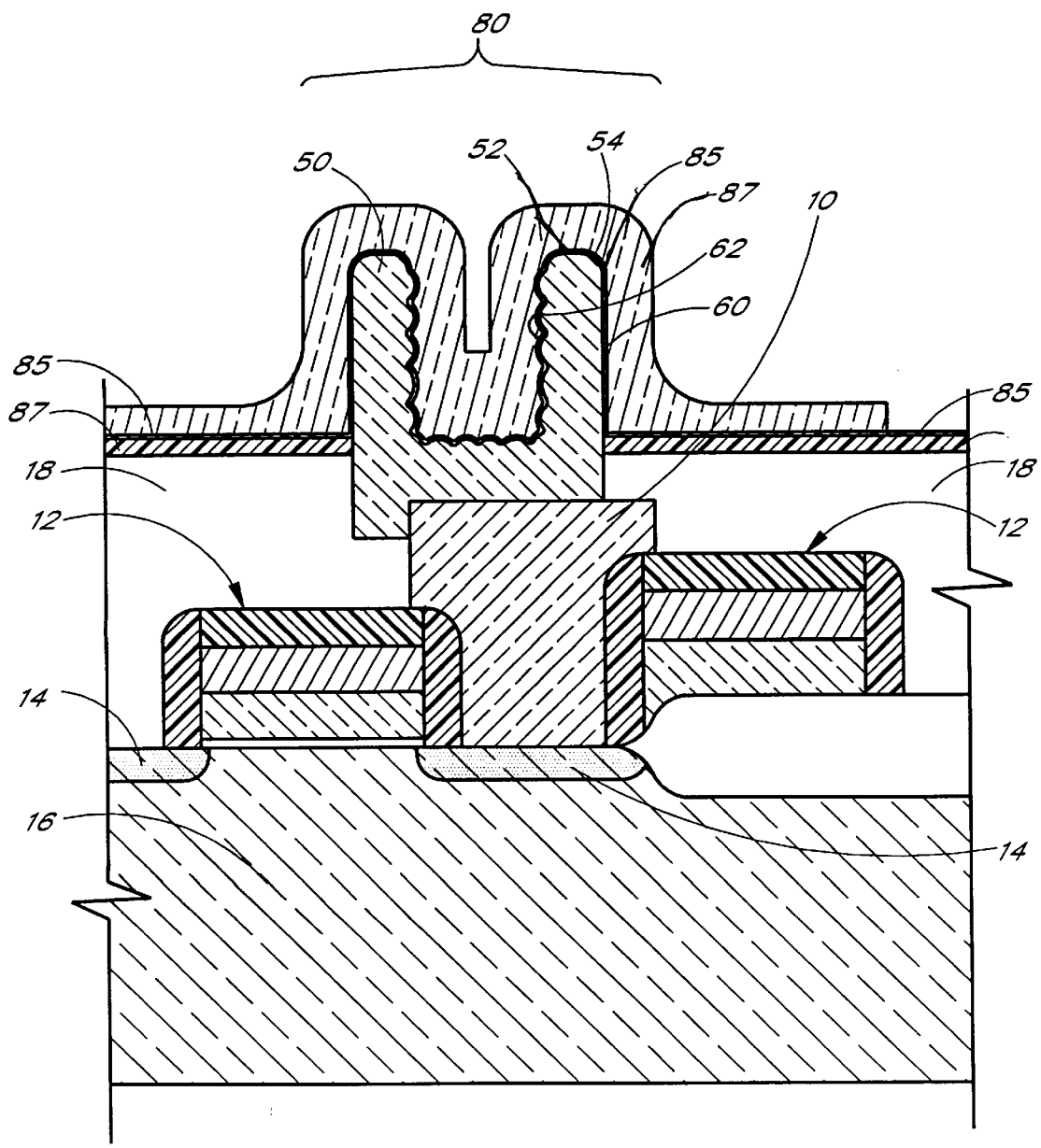
FIG. 6 is a cross sectional view of the memory cell following formation of the capacitor dielectric and top electrode layers.

Referring now to FIG. 6, a memory cell capacitor 80 is shown, wherein the modified container 50 comprises the bottom electrode. A thin capacitor cell dielectric 85 is deposited over the modified container 50. The preferred dielectric 85 comprises an oxide-nitride complex (ON), though any suitable dielectric material may be used. Note that, as described, the thin dielectric 85 lies conformally superjacent the rough interior surface 62 as modified by the preferred APM etch. Preferably, the dielectric 85 is deposited to a thickness of between about 30 Å and 150 Å, most preferably about 70 Å. Such a uniformly thick dielectric layer 85 will demonstrate greater reliability than prior art dielectric layers of comparable thickness over unetched HSG silicon. A top or reference electrode layer 87, preferably comprising doped polysilicon, is thereafter deposited over the cell dielectric 85. From this point, the wafer may be completed using conventional fabrication process steps.

The invention and its advantages will be understood from the foregoing description and it will be apparent that various changes may be made in the form, construction and arrangements of the parts of the invention without departing from the spirit and scope thereof or sacrificing its material advantages. The arrangements described are merely by way of example. We do not wish to be restricted to the specific forms shown or uses mentioned except as defined in the following claims.

We claim:

1. A process for fabricating a bottom electrode with rounded corners for an integrated memory cell capacitor, the process comprising the steps of:

forming a bottom electrode structure within an integrated circuit, the bottom electrode comprising sharp electrode corners; and rounding the sharp electrode corners by exposing the sharp electrode corners to an isotropic etchant comprising a mixture of ammonium hydroxide and hydrogen peroxide.

2. The process of claim 1, wherein the isotropic etchant comprises a ratio of ammonium hydroxide to peroxide to water in the range of about 10:1:1 to about 1:1:1.

3. The process of claim 1, wherein the electrode corners are exposed to the etchant for between about 5 minutes and 30 minutes.

4. The process of claim 3, wherein the electrode corners are exposed to the etchant for between about 10 minutes and 20 minutes.

5. The process of claim 1, wherein forming the bottom electrode comprises forming hemispherical grained silicon prior to rounding the sharp electrode corners.

6. A process for fabricating an integrated container capacitor characterized by a high breakdown voltage, the process comprising the steps of:

forming a via in a structural layer overlying a semiconductor substrate;

forming a rough conductive silicon layer within the via and over the structural layer, the silicon layer forming electrical contact with the substrate;

at least substantially filling the silicon-lined via with a photoresist filler;

performing a chemical mechanical planarization to remove silicon overlying the structural layer and leave an isolated conductive container having sharp corners;

removing the photoresist filler and the structural layer;

exposing said conductive container to an ammonium hydroxide/peroxide mixture after removing the photoresist filler and the structural layer;

forming a dielectric layer of substantially uniform thickness over and directly contacting the conductive container; and forming a conductive layer over and directly contacting the dielectric layer.

7. A process for fabricating a bottom electrode plate for a capacitor, said process comprising the steps of:

forming said bottom electrode plate;

forming a layer of hemispherical grained (HSG) silicon on a surface of said bottom electrode plate;

isolating said bottom electrode plate from other bottom electrode plates after forming said layer of HSG silicon; and rounding corners of said bottom electrode plate with an ammonium hydroxide/peroxide mixture.

8. A process for fabricating a bottom electrode with rounded corners for an integrated memory cell capacitor, the process comprising:

forming a bottom electrode structure within an integrated circuit, the bottom electrode comprising sharp corners; and rounding the sharp corners by exposing the sharp electrode corners to an isotropic etchant, wherein forming the bottom electrode comprises forming hemispherical grained silicon before rounding the sharp corners.

9. The process as recited in claim 8, wherein the isotropic etchant further separates silicon grains of the hemispherical grained silicon from one another.

10. A process for fabricating a bottom electrode with rounded corners for an integrated memory cell capacitor, the process comprising the steps of:

forming a plurality of bottom electrode structures within an integrated circuit;

isolating the bottom electrode structures from one another by chemical mechanical planarization, the planarization forming sharp corners on the bottom electrode structures; and rounding the sharp corners by exposing the sharp corners to a mixture of ammonium hydroxide and hydrogen peroxide.

11. The process of claim 10, wherein the bottom electrode comprises hemispherical grained silicon.

* * * * *

UNITED STATES PATENT AND TRADEMARK OFFICE
CERTIFICATE OF CORRECTION

PATENT NO. : 5,985,732
DATED : November 16, 1999
INVENTOR(S) : Pierre C. Fazan, Thomas A. Figura, Klaus F. Schuegraf It is certified that error appears in the above-indentified patent and that said Letters Patent is hereby corrected as shown below:

Column 4, line 30, delete "metal suicides" and insert therefor --metal silicides--
Column 7, line 16, delete "90°0" and insert therefor --90°--
Claim 2, column 9, line 34, delete "to peroxide" and insert therefor --to hydrogen peroxide--

Signed and Sealed this

Third Day of April, 2001

Attest:

NICHOLAS P. GODICI

Attesting Officer    Acting Director of the United States Patent and Trademark Office